US012772668B2

(12) United States Patent
Aoki et al.

(10) Patent No.: US 12,772,668 B2
(45) Date of Patent: Oct. 20, 2026

(54) DISPLAY DEVICE

(71) Applicant: Magnolia White Corporation, Tokyo (JP)

(72) Inventors: Hayata Aoki, Tokyo (JP); Hiroumi Kinjo, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 160 days.

(21) Appl. No.: 18/926,359

(22) Filed: Oct. 25, 2024

(65) Prior Publication Data

US 2025/0143094 A1 May 1, 2025

(30) Foreign Application Priority Data

Oct. 30, 2023 (JP) ................................ 2023-185591

(51) Int. Cl.
*H10K 59/122* (2023.01)
*H10K 59/12* (2023.01)
*H10K 59/80* (2023.01)
*H10K 102/00* (2023.01)

(52) U.S. Cl.
CPC ....... *H10K 59/122* (2023.02); *H10K 59/1201* (2023.02); *H10K 59/80515* (2023.02); *H10K 59/80522* (2023.02); *H10K 2102/351* (2023.02)

(58) Field of Classification Search
CPC ............. H10K 59/122; H10K 59/1201; H10K 59/80515; H10K 59/80522; H10K 2102/351
See application file for complete search history.

(56) References Cited

U.S. PATENT DOCUMENTS 12,433,097 B2 * 9/2025 Imai .................. H10K 59/1201
12,520,707 B2 * 1/2026 Tabatake .............. H10K 59/873
2013/0001620 A1 * 1/2013 Sugisawa ............. H10K 59/122 257/E33.062
2019/0334112 A1 * 10/2019 Lee ...................... H10K 59/122
2020/0258960 A1 * 8/2020 Choi ..................... H10K 59/121
2022/0157899 A1 * 5/2022 Yanagisawa ........... H10K 59/88
2023/0219114 A1 * 7/2023 Takenaka ................. B05D 1/60 427/255.6
2024/0138210 A1 * 4/2024 Kong ................... H10K 59/353

FOREIGN PATENT DOCUMENTS

JP 2008-135325 A 6/2008

* cited by examiner

*Primary Examiner* — Mary Ellen Bowman
(74) *Attorney, Agent, or Firm* — XSENSUS LLP

(57) ABSTRACT

According to one embodiment, a display device includes a substrate, an organic insulating layer provided on the substrate and having a recess portion, a lower electrode provided in the recess portion and embedded in the organic insulating layer, a rib which has a pixel aperture overlapping the lower electrode, an auxiliary line which includes a conductive lower portion and an upper portion, an upper electrode which faces the lower electrode and is connected to the auxiliary line, and an organic layer which is provided between the lower electrode and the upper electrode. An upper surface of the lower electrode is exposed from the organic insulating layer in the pixel aperture and is in contact with the organic layer.

11 Claims, 9 Drawing Sheets

DISPLAY DEVICE

CROSS-REFERENCE TO RELATED APPLICATION

This application is based upon and claims the benefit of priority from Japanese Patent Application No. 2023-185591, filed Oct. 30, 2023, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer. The organic layer is formed by, for example, a vacuum deposition method.

For example, in case of mask deposition, a fine mask which has an aperture corresponding to each pixel is applied. However, in consideration of the processing accuracy of the fine mask etc., it is difficult to increase the definition beyond the current definition and increase the aperture ratio beyond the current aperture ratio.

In view of the above matters, instead of the fine mask, a technique which divides the organic layer and the upper electrode by using a pixel division structure is contrived. However, when the pixel division structure is used, a display failure may occur since part of the pixel division structure is attached as a foreign substance, or the formation accuracy of thin films may be decreased because of the deformation of the pixel division structure. Thus, the reliability of the display device is decreased.

DETAILED DESCRIPTION

Figure 1:
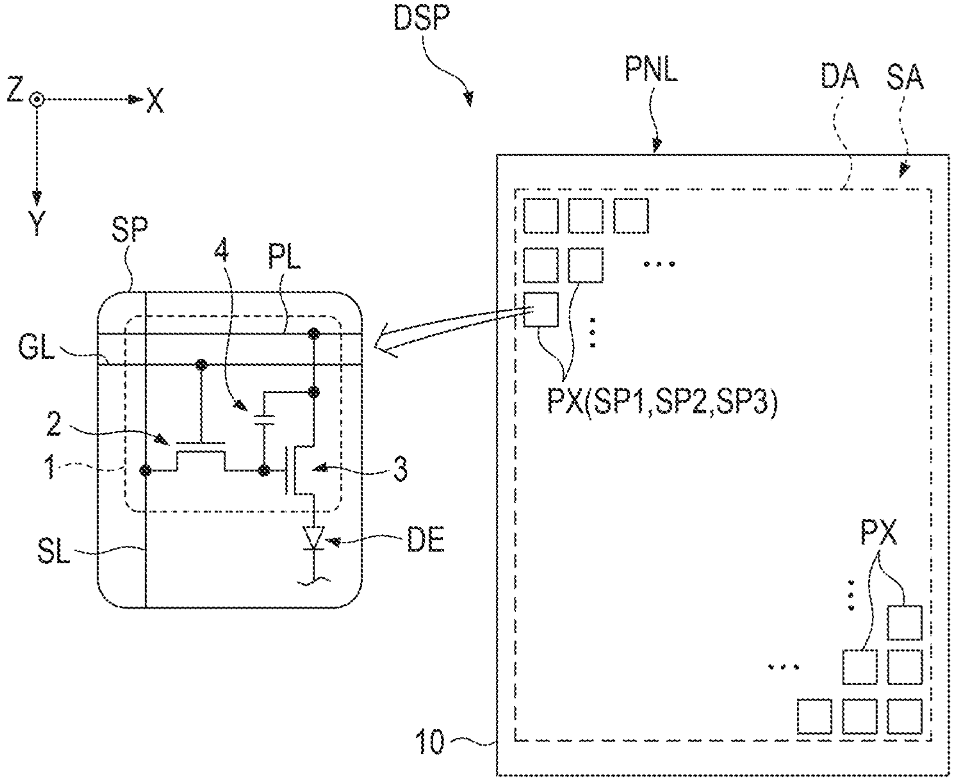
FIG. 1 is a diagram showing a configuration example of a display device according to an embodiment.

In general, according to one embodiment, a display device comprises a substrate, an organic insulating layer provided on the substrate and having a recess portion, a lower electrode provided in the recess portion and embedded in the organic insulating layer, a rib which has a pixel aperture overlapping the lower electrode, an auxiliary line which includes a conductive lower portion provided on the rib and an upper portion having an end portion protruding from a side surface of the lower portion, an upper electrode which faces the lower electrode and is connected to the auxiliary line, and an organic layer which is provided between the lower electrode and the upper electrode and emits light based on a potential difference between the lower electrode and the upper electrode. An upper surface of the lower electrode is exposed from the organic insulating layer in the pixel aperture and is in contact with the organic layer.

According to another embodiment, a display device comprises a substrate, a first organic insulating layer provided on the substrate, a second organic insulating layer provided on the first organic insulating layer, a lower electrode embedded in the first organic insulating layer and the second organic insulating layer, a rib which has a pixel aperture overlapping the lower electrode, an auxiliary line which includes a conductive lower portion provided on the rib and an upper portion having an end portion protruding from a side surface of the lower portion, an upper electrode which faces the lower electrode and is connected to the auxiliary line, and an organic layer which is provided between the lower electrode and the upper electrode and emits light based on a potential difference between the lower electrode and the upper electrode. An upper surface of the lower electrode is exposed from the second organic insulating layer in the pixel aperture and is in contact with the organic layer.

Embodiments will be described hereinafter with reference to the accompanying drawings.

The disclosure is merely an example, and the invention is not limited by contents described in the embodiments described below. Modification which is easily conceivable by a person of ordinary skill in the art comes within the scope of the disclosure as a matter of course. In order to make the description clearer, the sizes, shapes and the like of the respective parts may be changed and illustrated schematically in the drawings as compared with those in an accurate representation. Constituent elements corresponding to each other in a plurality of drawings are denoted by like reference numbers and their detailed descriptions may be omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. The third direction Z is a normal direction relative to a plane including the first direction X and the second direction Y. When various elements are viewed parallel to the third direction Z, the appearance is defined as a plan view.

The display device of the present embodiment is an organic electroluminescent display device comprising an organic light emitting diode (OLED) as a display element, and could be mounted on various types of electronic devices such as a television, a personal computer, a vehicle-mounted device, a tablet, a smartphone, a mobile phone and a wearable terminal.

FIG. 1 is a diagram showing a configuration example of a display device DSP according to an embodiment. The display device DSP comprises a display panel PNL including an insulating substrate 10. The display panel PNL has a display area DA which displays an image, and a surrounding area SA around the display area DA. The substrate 10 may be glass or a resinous film having flexibility.

In the embodiment, the substrate 10 is rectangular as seen in plan view. It should be noted that the shape of the substrate 10 in plan view is not limited to a rectangle and may be another shape such as a square, a circle or an oval.

The display area DA comprises a plurality of pixels PX arrayed in matrix in a first direction X and a second direction Y. Each pixel PX includes a plurality of subpixels SP. For example, each pixel PX includes a red subpixel SP1, a green subpixel SP2 and a blue subpixel SP3. It should be noted that each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. Each of the pixel switch 2 and the drive transistor 3 is, for example, a switching element consisting of a thin-film transistor.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE.

It should be noted that the configuration of the pixel circuit 1 is not limited to the example shown in the figure. For example, the pixel circuit 1 may comprise more thin-film transistors and capacitors.

Figure 2:
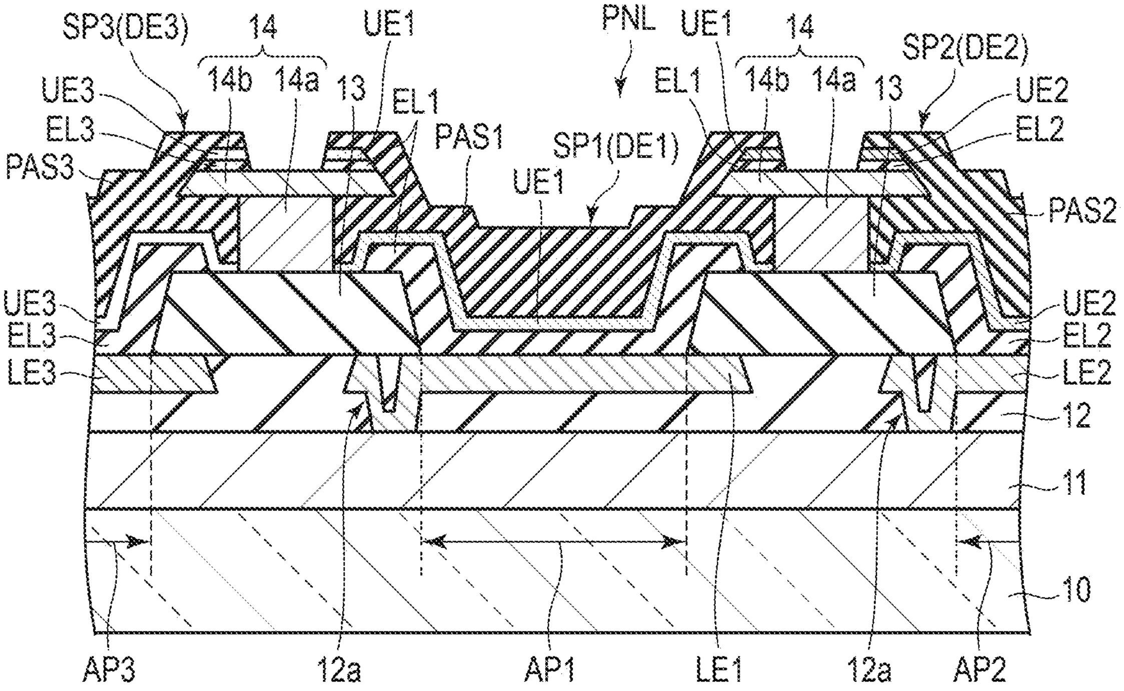
FIG. 2 is a cross-sectional view showing a configuration example of a display panel according to the embodiment.

FIG. 2 is a schematic cross-sectional view of the display panel PNL according to the embodiment. A circuit layer 11 is provided on the substrate 10 described above. The circuit layer 11 includes various circuits and lines such as the pixel circuits 1, scanning lines GL, signal lines SL and power lines PL shown in FIG. 1. The circuit layer 11 is covered with an organic insulating layer 12.

The organic insulating layer 12 functions as a planarization film which planarizes the irregularities formed by the circuit layer 11. The organic insulating layer 12 has a plurality of recess portions 12*a*. In one of the recess portions 12*a*, a lower electrode LE1 which constitutes subpixel SP1 is provided. In another recess portion 12*a*, a lower electrode LE2 which constitutes subpixel SP2 is provided. In yet another recess portion 12*a*, a lower electrode LE3 which constitutes subpixel SP3 is provided. In other words, the lower electrodes LE1, LE2 and LE3 are embedded in the organic insulating layer 12. The process of forming the lower electrodes LE1, LE2 and LE3 are described later, detailed description thereof being omitted here. The recess portions described in this specification may be called contact holes.

A rib 13 is provided on the organic insulating layer 12 and the lower electrodes LE1, LE2 and LE3. The rib 13 has pixel apertures AP1, AP2 and AP3 in subpixels SP1, SP2 and SP3, respectively. More specifically, the rib 13 has the pixel apertures AP1, AP2 and AP3 which expose part of the lower electrodes LE1, LE2 and LE3.

An organic layer EL1 which constitutes subpixel SP1 is provided on the lower electrode LE1. The organic layer EL1 covers the lower electrode LE1 through the pixel aperture AP1. An upper electrode UE1 which constitutes subpixel SP1 is provided on the organic layer EL1. The upper electrode UE1 covers the organic layer EL1 and faces the lower electrode LE1.

An organic layer EL2 which constitutes subpixel SP2 is provided on the lower electrode LE2. The organic layer EL2 covers the lower electrode LE2 through the pixel aperture AP2. An upper electrode UE2 which constitutes subpixel SP2 is provided on the organic layer EL2. The upper electrode UE2 covers the organic layer EL2 and faces the lower electrode LE2.

An organic layer EL3 which constitutes subpixel SP3 is provided on the lower electrode LE3. The organic layer EL3 covers the lower electrode LE3 through the pixel aperture AP3. An upper electrode UE3 which constitutes subpixel SP3 is provided on the organic layer EL3. The upper electrode UE3 covers the organic layer EL3 and faces the lower electrode LE3.

Of the lower electrode LE1, the organic layer EL1 and the upper electrode UE1, the portions which overlap the pixel aperture AP1 constitute the display element DE1 of subpixel SP1. Of the lower electrode LE2, the organic layer EL2 and the upper electrode UE2, the portions which overlap the pixel aperture AP2 constitute the display element DE2 of subpixel SP2. Of the lower electrode LE3, the organic layer EL3 and the upper electrode UE3, the portions which overlap the pixel aperture AP3 constitute the display element DE3 of subpixel SP3.

An insulating film PAS1 is provided on the upper electrode UE1. An insulating film PAS2 is provided on the upper electrode UE2. An insulating film PAS3 is provided on the upper electrode UE3. The insulating films PAS1, PAS2 and PAS3 continuously cover the upper electrodes UE1, UE2 and UE3, respectively, and the side surfaces of the auxiliary lines 14 described later. The display elements DE1, DE2 and DE3 may further include these insulating films PAS1, PAS2 and PAS3. The rib 13 surrounds each of these display elements DE1, DE2 and DE3.

The auxiliary lines 14 are provided on the rib 13. Each auxiliary line 14 includes a conductive lower portion 14*a* provided on the rib 13, and an upper portion 14*b* provided on the lower portion 14*a*. The upper portion 14*b* has a width which is greater than that of the lower portion 14*a*. By this configuration, the both end portions of the upper portion 14*b* protrude relative to the side surfaces of the lower portion 14*a*. The upper electrodes UE1, UE2 and UE3 are in contact with the side surfaces of the lower portions 14*a* of the auxiliary lines 14.

Each of the organic layer EL1 and the upper electrode UE1 is partly located on the upper portion 14*b* of the auxiliary line 14. This portion is spaced apart from, of the organic layer EL1 and the upper electrode UE1, the portion located under the auxiliary line 14 (in other words, the portion which constitutes the display element DE1). Similarly, each of the organic layer EL2 and the upper electrode UE2 is partly located on the upper portion 14*b* of the auxiliary line 14. This portion is spaced apart from, of the organic layer EL2 and the upper electrode UE2, the portion located under the auxiliary line 14 (in other words, the portion which constitutes the display element DE2). Further, each of the organic layer EL3 and the upper electrode UE3 is partly located on the upper portion 14*b* of the auxiliary line 14. This portion is spaced apart from, of the organic layer EL3 and the upper electrode UE3, the portion located under the auxiliary line 14 (in other words, the portion which constitutes the display element DE3).

The organic insulating layer 12 is formed of an organic insulating material. The rib 13 is formed of an insulating material such as silicon nitride (SiNx), silicon oxide (SiOx), polyimide or acrylic, or a combination of these insulating materials.

Each of the lower electrodes LE1, LE2 and LE3 has a reflective layer formed of, for example, silver (Ag), and a pair of conductive oxide layers covering the upper and lower surfaces of the reflective layer. Each of the conductive oxide layers can be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

Each of the organic layers EL1, EL2 and EL3 comprises a multilayer structure consisting of, for example, a hole injection layer, a hole transport layer, an electron blocking layer, a light emitting layer, a hole blocking layer, an electron transport layer and an electron injection layer. Each of the organic layers EL1, EL2 and EL3 may comprise a tandem structure including a plurality of light emitting layers.

The lower portion 14*a* of each auxiliary line 14 is formed of, for example, aluminum. The lower portion 14*a* may be formed of an aluminum alloy such as an aluminum-neodymium alloy (AlNd), an aluminum-yttrium alloy (AlY) or an aluminum-silicon alloy (AlSi), or may comprise a multilayer structure consisting of an aluminum layer and an aluminum alloy layer. Further, the lower portion 14*a* may have a bottom layer formed of a metal material different from aluminum and an aluminum alloy under the aluminum layer or the aluminum alloy layer. For the metal material forming the bottom layer, for example, molybdenum (Mo), titanium nitride (TiN), a molybdenum-tungsten alloy (MoW) or a molybdenum-niobium alloy (MoNb) may be used.

The upper portion 14*b* of each auxiliary line 14 comprises a multilayer structure consisting of a lower layer formed of a metal material and an upper layer formed of conductive oxide. For the metal material forming the lower layer, for example, titanium, titanium nitride, molybdenum, tungsten, a molybdenum-tungsten alloy or a molybdenum-niobium alloy can be used. For the conductive oxide forming the upper layer, for example, ITO or IZO can be used. It should be noted that the upper portion 14*b* may comprise a single-layer structure of a metal material.

Common voltage is applied to the auxiliary lines 14. This common voltage is applied to the upper electrodes UE1, UE2 and UE3 which are in contact with the side surfaces of the lower portions 14*a*. Pixel voltage is applied to the lower electrodes LE1, LE2 and LE3 through the pixel circuits 1 provided in subpixels SP1, SP2 and SP3, respectively.

The organic layers EL1, EL2 and EL3 emit light based on the application of voltage. Specifically, when a potential difference is formed between the lower electrode LE1 and the upper electrode UE1, the light emitting layer of the organic layer EL1 emits light in a red wavelength range. When a potential difference is formed between the lower electrode LE2 and the upper electrode UE2, the light emitting layer of the organic layer EL2 emits light in a green wavelength range. When a potential difference is formed between the lower electrode LE3 and the upper electrode UE3, the light emitting layer of the organic layer EL3 emits light in a blue wavelength range.

As another example, the light emitting layers of the organic layers EL1, EL2 and EL3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including quantum dots which generate light exhibiting colors corresponding to subpixels SP1, SP2 and SP3 by the excitation caused by the light emitted from the light emitting layers.

Figure 3:
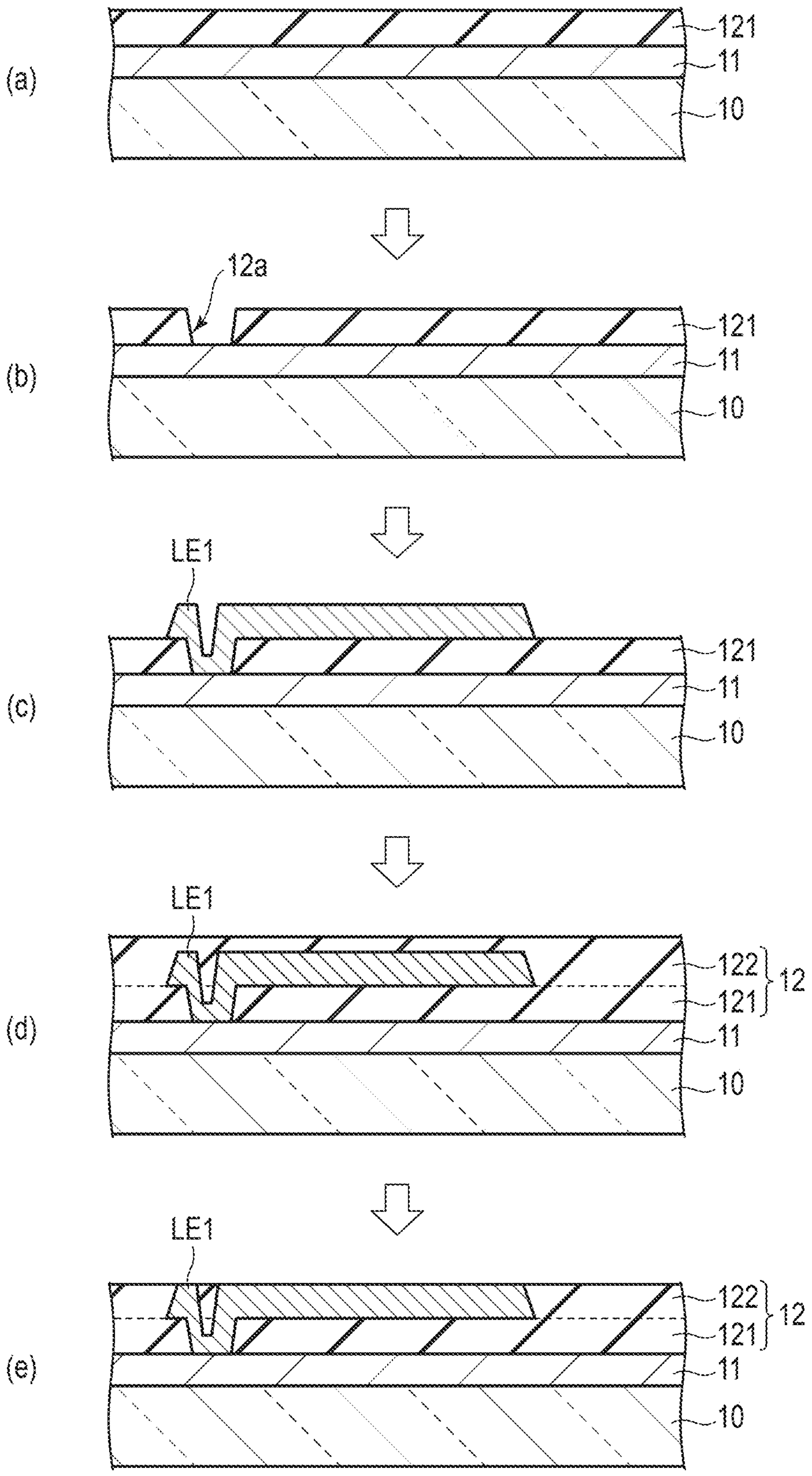
FIG. 3 is a diagram for explaining the process of forming a lower electrode according to the embodiment.

FIG. 3 is a diagram for explaining the process of forming the lower electrode LE1 shown in FIG. 2. Although detailed explanations are omitted here, the lower electrodes LE2 and LE3 can be formed by similar processes.

First, a first organic insulating layer 121 is formed on the circuit layer 11 (see FIG. 3(*a*)).

Subsequently, the first organic insulating layer 121 is patterned, and the recess portion 12*a* is formed (see FIG. 3(*b*)). The recess portion 12*a* is formed at, for example, a position which overlaps an element for the electrical connection with the pixel circuit 1 provided in subpixel SP1 (for example, one of the source electrode and drain electrode of the drive transistor 3).

Subsequently, the lower electrode LE1 is formed so as to cover the recess portion 12*a* formed in the first organic insulating layer 121 (see FIG. 3(*c*)).

Subsequently, a second organic insulating layer 122 is formed so as to cover the first organic insulating layer 121 and the lower electrode LE1 (see FIG. 3(*d*)).

Subsequently, the second organic insulating layer 122 is patterned such that the upper surface of the lower electrode LE1 is exposed, and thus, the lower electrode LE1 embedded in the organic insulating layer 12 is formed (see FIG. 3(*e*)). For example, the upper surface of the lower electrode LE1 and the upper surface of the second organic insulating layer 122 (organic insulating layer 12) are arranged so as to be flush with each other.

As described above, the organic insulating layer 12 comprises a structure in which two layers, specifically, the first organic insulating layer 121 and the second organic insulating layer 122, are stacked. It should be noted that the first organic insulating layer 121 and the second organic insulating layer 122 may be formed of the same organic insulating material or may be formed of different organic insulating materials. In the embodiment, for example, it is assumed that the first organic insulating layer 121 and the second organic insulating layer 122 are formed of the same organic insulating material.

Figure 4:
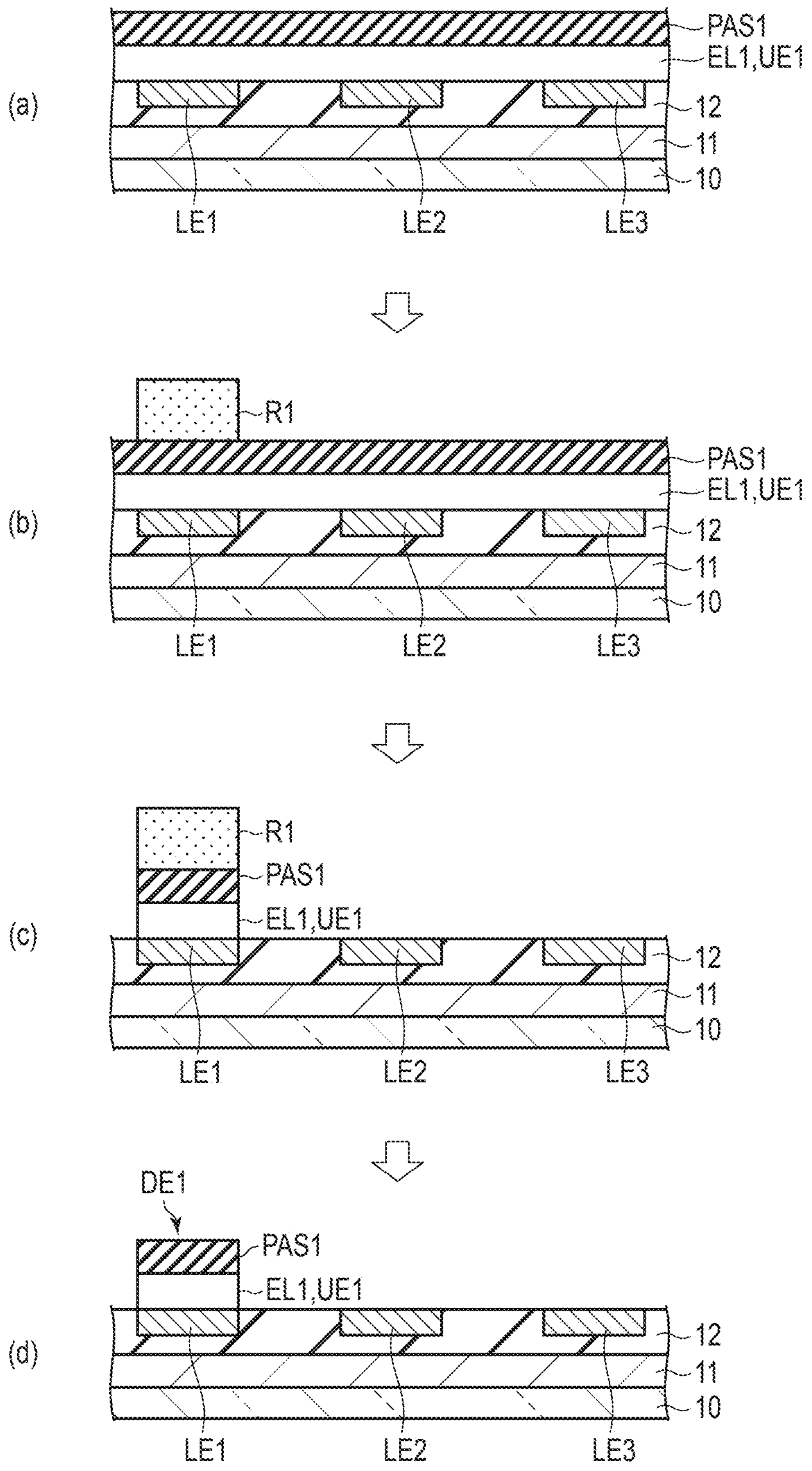
FIG. 4 is a diagram for explaining the process of forming a display element according to the embodiment.
Figure 5:
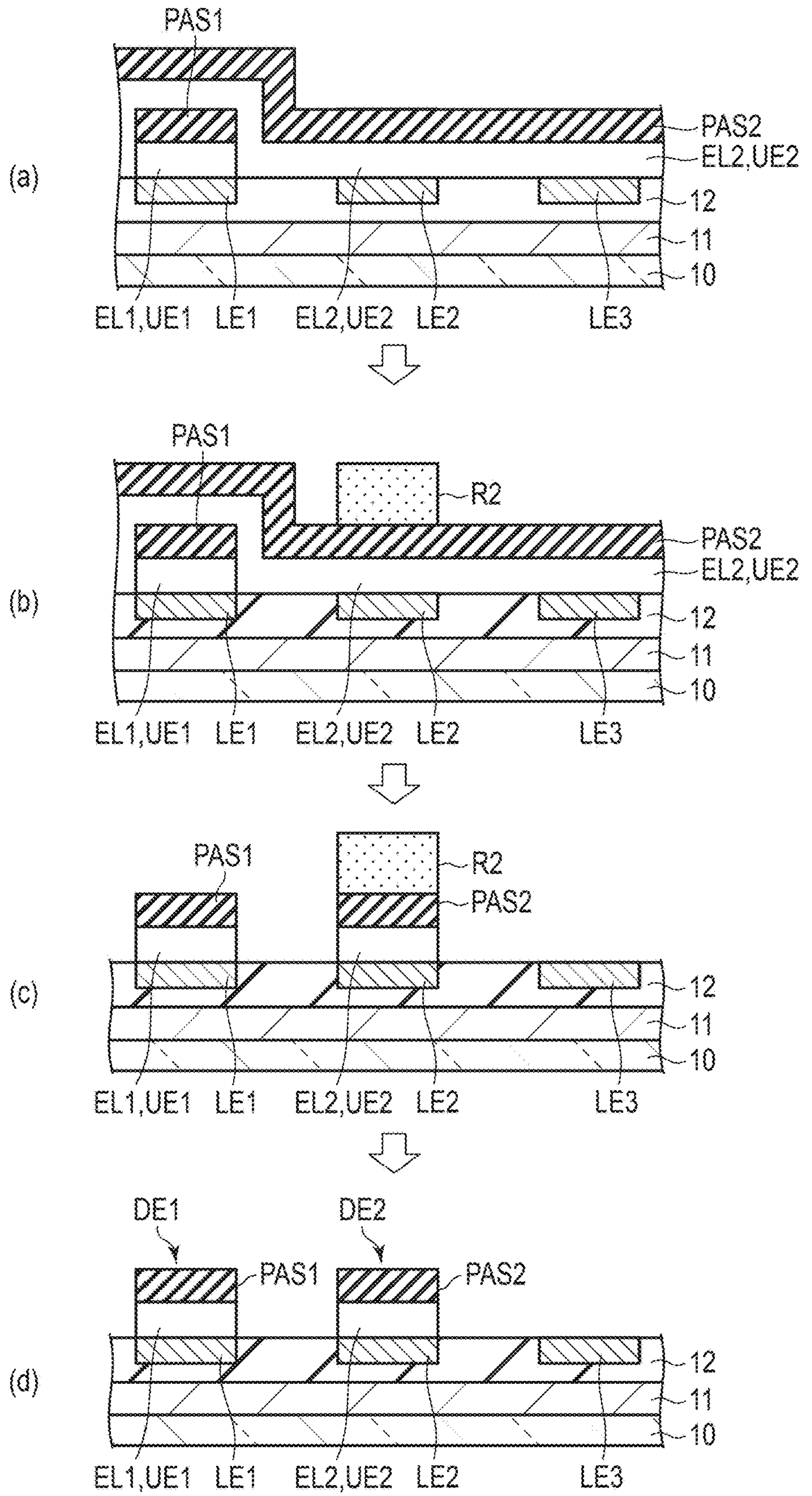
FIG. 5 is a diagram for explaining the process of forming a display element according to the embodiment.
Figure 6:
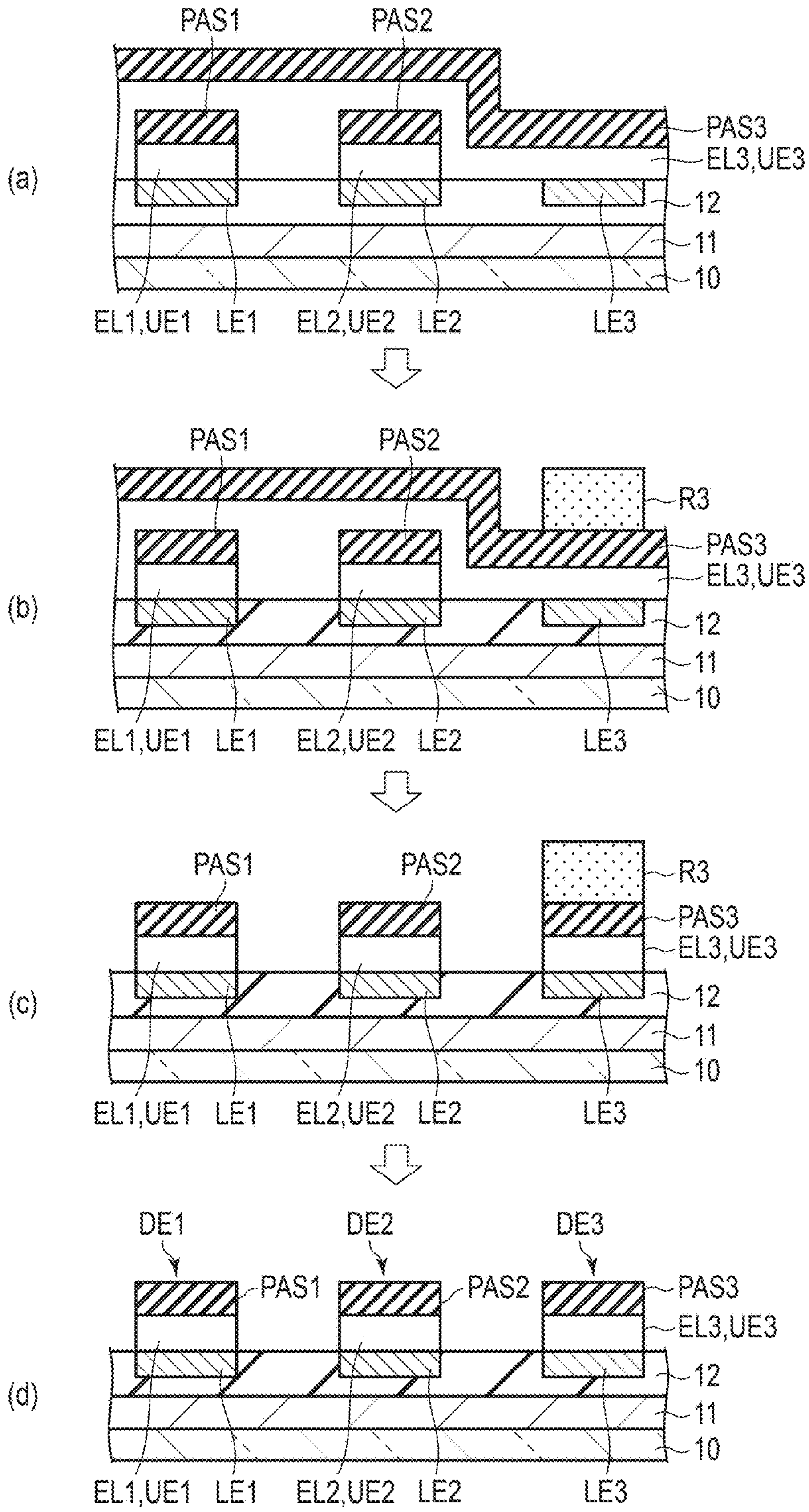
FIG. 6 is a diagram for explaining the process of forming a display element according to the embodiment.

FIG. 4 to FIG. 6 are diagrams for explaining the process of forming the display elements DE1, DE2 and DE3 of subpixels SP1, SP2 and SP3 shown in FIG. 2. FIG. 4 shows the process of forming the display element DE1 of subpixel SP1. FIG. 5 shows the process of forming the display element DE2 of subpixel SP2. FIG. 6 shows the process of forming the display element DE3 of subpixel SP3. It should be noted that the illustrations of the rib 13 and the auxiliary lines 14 are omitted in FIG. 4 to FIG. 6.

First, the circuit layer 11 is formed on the substrate 10. Subsequently, the organic insulating layer 12 and the lower electrodes LE1, LE2 and LE3 embedded in the organic insulating layer 12 are formed by performing the series of processes shown in FIG. 3.

Here, to form the display element DE1 of subpixel SP1, the organic layer EL1 and the upper electrode UE1 are deposited over the display area DA, and the insulating film PAS1 is formed by chemical vapor deposition (CVD) (see FIG. 4(*a*)).

Subsequently, a resist R1 is provided in an area corresponding to the display element DE1 (see FIG. 4(*b*)).

Subsequently, of the organic layer EL1, the upper electrode UE1 and the insulating film PAS1, the portions exposed from the resist R1 are eliminated by etching using the resist R1 as a mask (see FIG. 4(*c*)).

Subsequently, the resist R1 is eliminated, and the display element DE1 is formed (see FIG. 4(*d*)).

Subsequently, to form the display element DE2 of subpixel SP2, the organic layer EL2 and the upper electrode UE2 are deposited over the display area DA, and the insulating film PAS2 is formed by CVD (see FIG. 5(*a*)).

Subsequently, a resist R2 is provided in an area corresponding to the display element DE2 (see FIG. 5(*b*)).

Subsequently, of the organic layer EL2, the upper electrode UE2 and the insulating film PAS2, the portions exposed from the resist R2 are eliminated by etching using the resist R2 as a mask (see FIG. 5(*c*)).

Subsequently, the resist R2 is eliminated, and the display element DE2 is formed (see FIG. 5(*d*)).

Further, to form the display element DE3 of subpixel SP3, the organic layer EL3 and the upper electrode UE3 are deposited over the display area DA, and the insulating film PAS3 is formed by CVD (see FIG. 6(*a*)).

Subsequently, a resist R3 is provided in an area corresponding to the display element DE3 (see FIG. 6(*b*)).

Subsequently, of the organic layer EL3, the upper electrode UE3 and the insulating film PAS3, the portions exposed from the resist R3 are eliminated by etching using the resist R3 as a mask (see FIG. 6(*c*)).

Subsequently, the resist R3 is eliminated, and the display element DE3 is formed (see FIG. 6(*d*)).

In the following description, the effects of the display device DSP (display panel PNL) of the embodiment are explained using a comparative example. It should be noted that the comparative example is shown to explain part of the effects which could be obtained from the display device DSP (display panel PNL) of the embodiment and does not exclude structures or effects common to the embodiment and the comparative example from the scope of the present invention.

Figure 7:
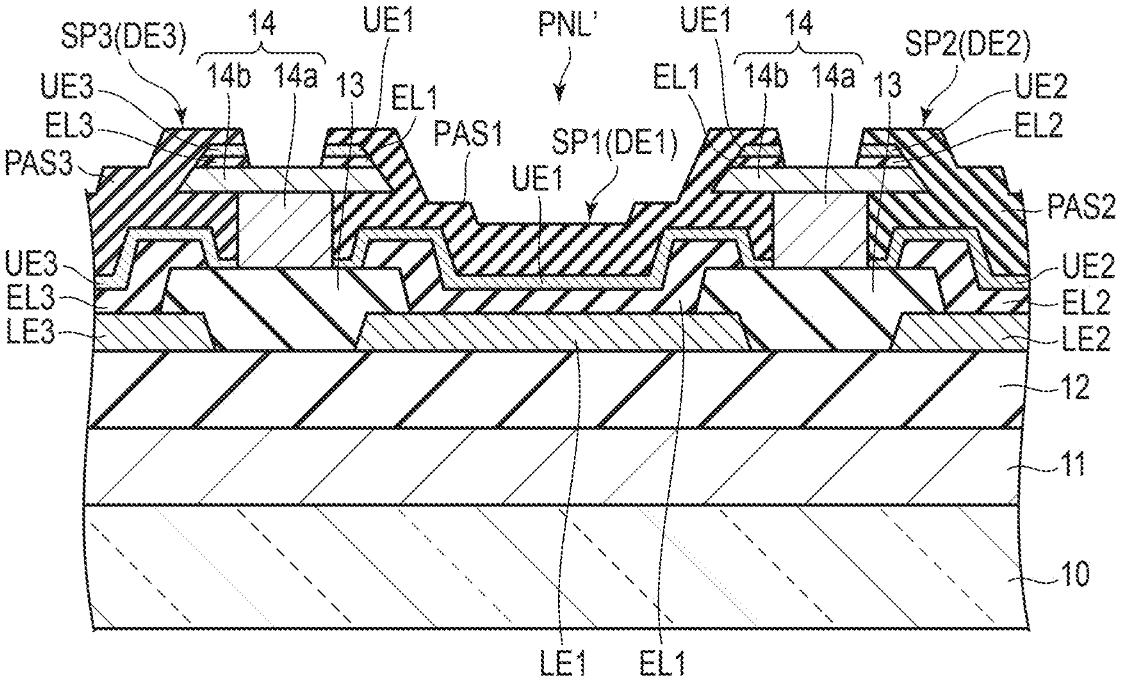
FIG. 7 is a cross-sectional view showing a configuration example of the display panel according to a comparative example.

FIG. 7 is a schematic cross-sectional view of the display panel PNL' provided in the display device according to a comparative example. The display panel PNL' of the comparative example is different from the display panel PNL of the embodiment in respect that the lower electrode LE is provided on the organic insulating layer 12, and the peripheral portion of the lower electrode LE is covered with the rib 13.

Figure 8:
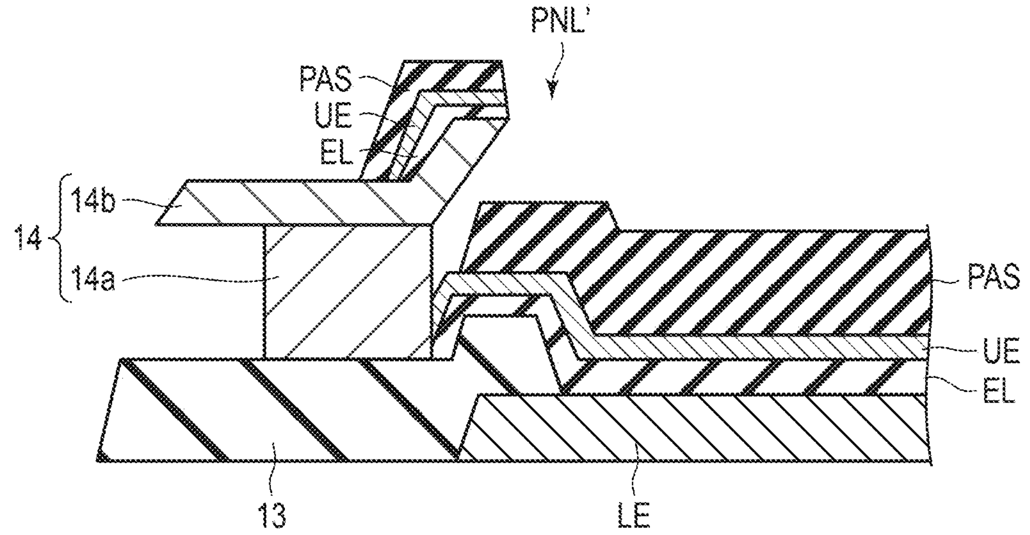
FIG. 8 is a cross-sectional view showing the configuration example of the display panel according to the comparative example.

In the display panel PNL' of the comparative example, as described above, the lower electrode LE is provided on the organic insulating layer 12. Therefore, as shown in FIG. 8, the thickness of the lower electrode LE cannot be absorbed by the rib 13, and thus, a step may be generated in the rib 13 because of the thickness of the lower electrode LE. If such a step is generated in the rib 13, as shown in FIG. 8, the upper portion 14*b* of the auxiliary line 14 may be bent. If the upper portion 14*b* of the auxiliary line 14 is bent, the shadowing effect by the upper portion 14*b* cannot be obtained. Thus, when the organic layer EL is deposited, the organic layer EL may be in contact with the side surface of the lower portion 14*a* of the auxiliary line 14, and thus, a display failure may occur. In addition, if the organic layer EL, the upper electrode UE and the insulating film PAS are deposited on the bent upper portion 14*b*, these layers become a load, and thus, the bent upper portion 14*b* is broken, and for example, this broken portion is attached to the upper surface of the lower electrode LE, and a display failure may be caused. Further, if the upper portion 14*b* of the auxiliary line 14 is bent, the insulating film PAS is divided in the middle, and thus, the insulating film PAS may not be able to cover the upper electrode UE and the side surface of the lower portion 14*a* of the auxiliary line 14.

To the contrary, in the display panel PNL of the embodiment, as shown in FIG. 2, the lower electrode LE is provided in the recess portion 12*a* of the organic insulating layer 12 and is embedded in the organic insulating layer 12. This configuration can prevent the generation of a step in the rib 13 because of the thickness of the lower electrode LE. In this manner, the display failure described above can be prevented, and thus, the reduction in the reliability of the display device DSP can be prevented.

Modified examples are explained below.

First Modified Example

A first modified example is different from the embodiment described above in respect that the organic insulating layer 12 is overetched to assuredly expose the upper surfaces of the lower electrodes LE1, LE2 and LE3 from the organic insulating layer 12.

Figure 9:
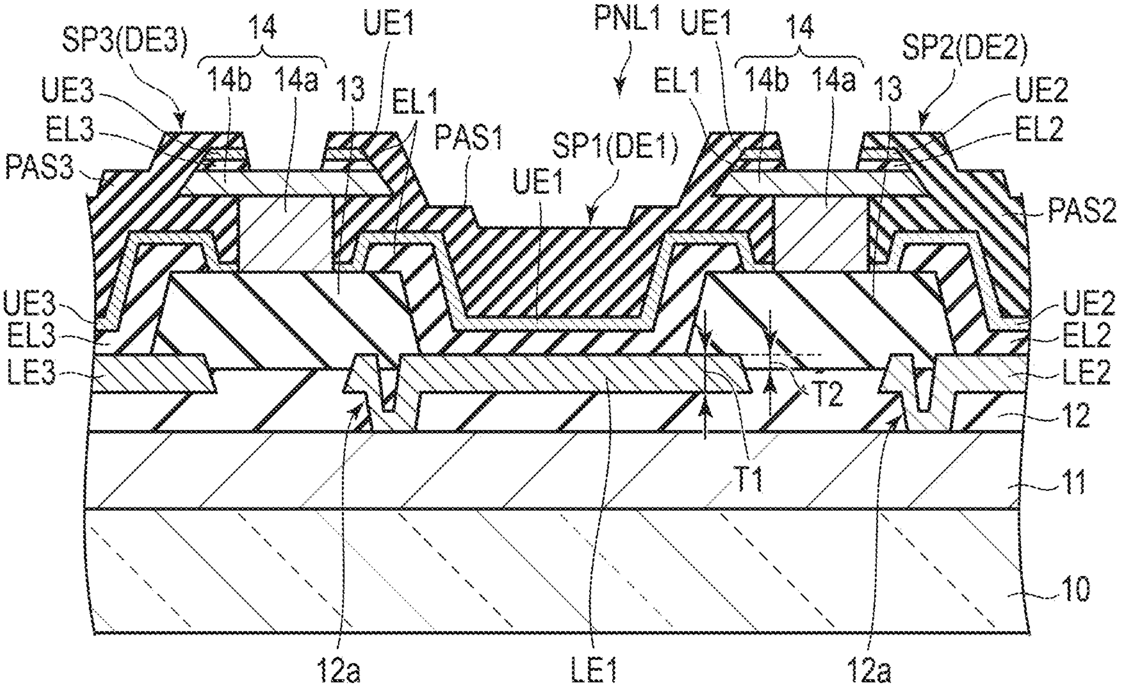
FIG. 9 is a cross-sectional view showing a configuration example of the display panel according to a first modified example.

FIG. 9 is a schematic cross-sectional view of the display panel PNL1 according to the first modified example. The display panel PNL1 comprises a structure in which the upper surfaces of the lower electrodes LE1, LE2 and LE3 protrude from the upper surface of the organic insulating layer 12 as the organic insulating layer 12 is overetched as described above.

Thickness T2 of the protrusion of each of the lower electrodes LE1, LE2 and LE3 protruding from the upper surface of the organic insulating layer 12 should be preferably less than or equal to 50% of thickness T1 of each of the lower electrodes LE1, LE2 and LE3 (in other words, the amount of film thinning by overetching should be preferably less than or equal to 50% of the thickness of each of the lower electrodes LE1, LE2 and LE3). This configuration can prevent the generation of a step in the rib 13 because of the protrusions of the lower electrodes LE1, LE2 and LE3.

As a method for overetching the organic insulating layer 12, for example, when the organic insulating layer 12 is formed of a photosensitive organic insulating material, the organic insulating layer 12 may be overetched by performing an oxygen plasma process or an argon plasma process after the organic insulating layer 12 is patterned such that the upper surfaces of the lower electrodes LE1, LE2 and LE3 are exposed.

When the organic insulating layer 12 is formed of an organic insulating material which is not photosensitive, the organic insulating layer 12 may be overetched by strengthening the etching condition or lengthening the etching time at the time of patterning the organic insulating layer 12.

Figure 10:
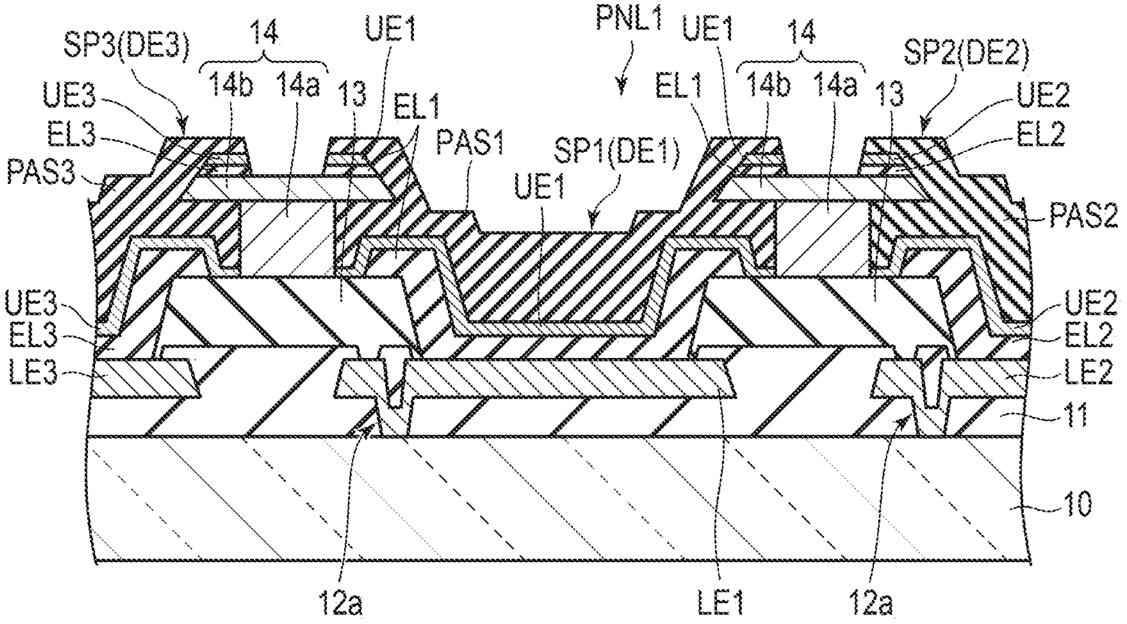
FIG. 10 is a cross-sectional view showing the configuration example of the display panel according to the first modified example.

FIG. 9 shows a structure which is realized when overetching is performed for the organic insulating layer 12 having a flat surface as a whole. However, to assuredly expose the upper surfaces of the lower electrodes LE1, LE2 and LE3, the organic insulating layer 12 may be formed such that areas overlapping the upper surfaces of the lower electrodes LE1, LE2 and LE3 are thinner than the other area. When overetching is performed for the organic insulating layer 12 in this state, as shown in FIG. 10, a structure in which the thickness of the organic insulating layer 12 differs between the areas overlapping the upper surfaces of the lower electrodes LE1, LE2 and LE3 and the other area is realized.

In the structure of the first modified example, similarly, the lower electrode LE is embedded in the organic insulating layer 12. Therefore, it is possible to prevent the generation of a step in the rib 13 because of the thickness of the lower electrode LE.

Second Modified Example

A second modified example is different from the embodiment described above in terms of the process of forming the lower electrodes LE1, LE2 and LE3 embedded in the organic insulating layer 12. Specifically, as shown in FIG. 3, the embodiment stated above shows a case where the lower electrodes LE1, LE2 and LE3 embedded in the organic insulating layer 12 are formed in the order of the first organic insulating layer 121, the lower electrodes LE1, LE2 and LE3 and the second organic insulating layer 122. However, in this modified example, the lower electrodes LE1, LE2 and LE3 embedded in the organic insulating layer 12 are formed in the order of the first organic insulating layer 121, the second organic insulating layer 122 and the lower electrodes LE1, LE2 and LE3.

Figure 11:
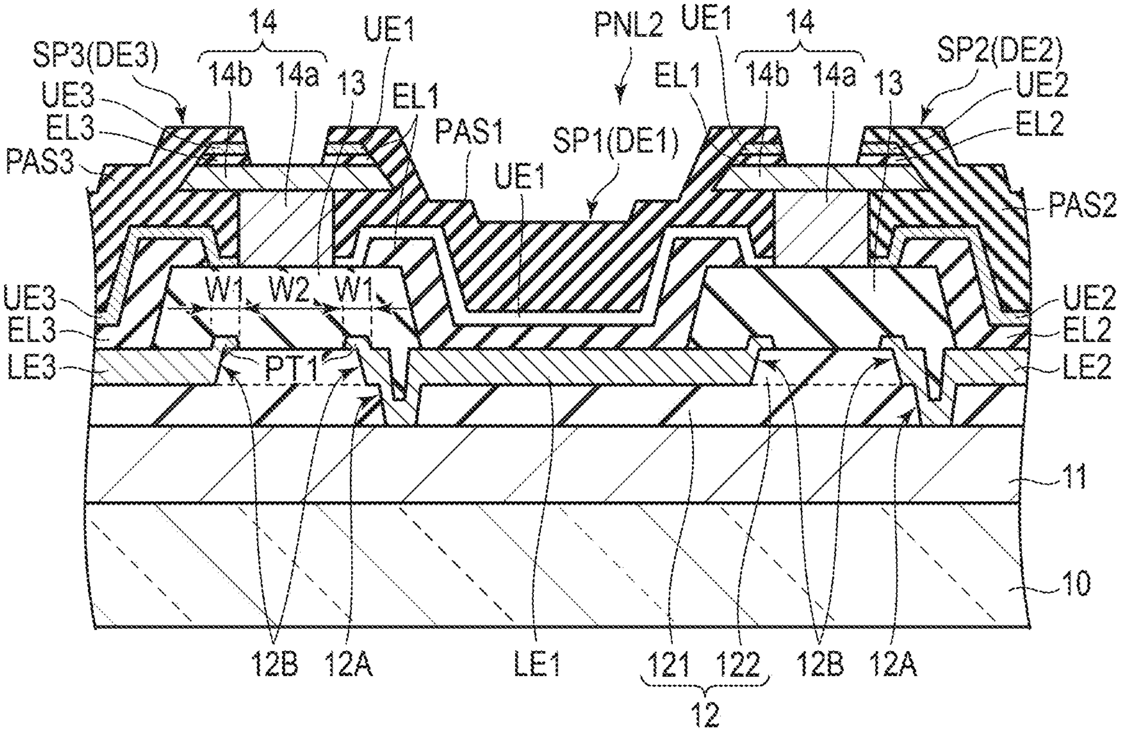
FIG. 11 is a cross-sectional view showing a configuration example of the display panel according to a second modified example.
Figure 12:
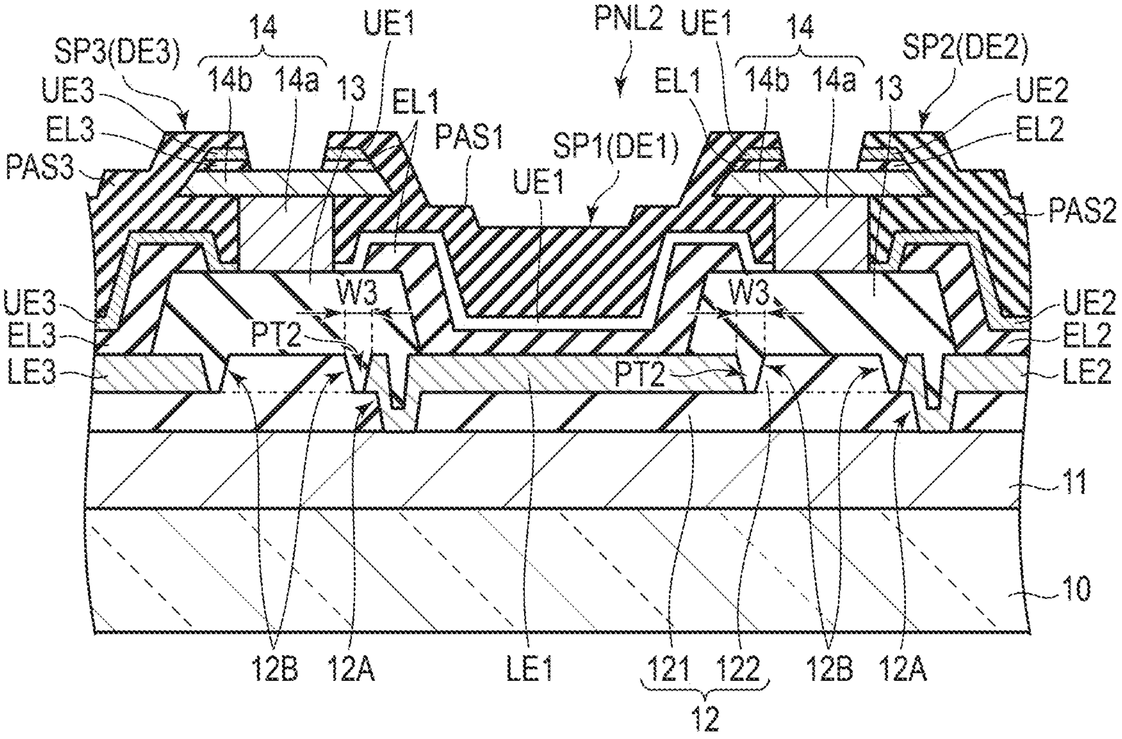
FIG. 12 is a cross-sectional view showing the configuration example of the display panel according to the second modified example.

FIG. 11 and FIG. 12 are schematic cross-sectional views of the display panel PNL2 according to the second modified example. The display panel PNL2 has a first recess portion 12A formed in the first organic insulating layer 121 which constitutes the organic insulating layer 12, and a second recess portion 12B formed in the second organic insulating layer 122 which constitutes the organic insulating layer 12. It is preferable that the second recess portion 12B should overlap the first recess portion 12A and be larger than the first recess portion 12A as seen in plan view. In other words, the first recess portion 12A should be preferably surrounded by the second recess portion 12B as seen in plan view.

The display panel PNL2 of the second modified example may comprise a structure in which the peripheral portion of each of the lower electrodes LE1, LE2 and LE3 provided in the first recess portion 12A and the second recess portion 12B runs onto the second organic insulating layer 122 as shown in FIG. 11. In each of the lower electrodes LE1, LE2 and LE3, width W1 of each portion which runs onto the second organic insulating layer 122 (hereinafter, referred to as an overlapping portion PT1) should be preferably approximately 10% of the length between the end portion of this overlapping portion PT1 and the end portion of the overlapping portion PT1 of the lower electrode LE which constitutes the adjacent subpixel SP (in other words, width W2 of the exposed portion of the second organic insulating layer 122). This configuration can prevent the generation of a step in the rib 13 because of the overlapping portions PT1 of the lower electrodes LE1, LE2 and LE3.

Alternatively, the display panel PNL2 of the second modified example may comprise a structure which has a void PT2 between the peripheral portion of each of the lower electrodes LE1, LE2 and LE3 provided in the first recess portion 12A and the second recess portion 12B and the side surface of the second recess portion 12B as shown in FIG. 12. In other words, the peripheral portion of each of the lower electrodes LE1, LE2 and LE3 provided in the first recess portion 12A and the second recess portion 12B may be spaced apart from the side surface of the second recess portion 12B. It should be noted that width W3 of the void PT2 described above should be preferably approximately 10 μm. By this configuration, the void PT2 can be filled with (embedded by) the rib 13 provided on the organic insulating layer 12.

In the structure of the second modified example, similarly, the lower electrode LE is embedded in the organic insulating layer 12. Therefore, it is possible to prevent the generation of a step in the rib 13 because of the thickness of the lower electrode LE.

The embodiment explained above can provide a display device in which the reduction in reliability can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a substrate;
an organic insulating layer provided on the substrate and having a recess portion;
a lower electrode provided in the recess portion and embedded in the organic insulating layer;
a rib which has a pixel aperture overlapping the lower electrode;
an auxiliary line which includes a conductive lower portion provided on the rib and an upper portion having an end portion protruding from a side surface of the lower portion;
an upper electrode which faces the lower electrode and is connected to the auxiliary line; and
an organic layer which is provided between the lower electrode and the upper electrode and emits light based on a potential difference between the lower electrode and the upper electrode, wherein
an upper surface of the lower electrode is exposed from the organic insulating layer in the pixel aperture and is in contact with the organic layer.

2. The display device of claim 1, wherein
the upper surface of the lower electrode and an upper surface of the organic insulating layer are arranged so as to be flush with each other.

3. The display device of claim 1, wherein
the lower electrode has a protrusion which protrudes from an upper surface of the organic insulating layer in a thickness direction, and
a thickness of the protrusion is less than or equal to half of a thickness of the lower electrode.

4. The display device of claim 1, wherein
a peripheral portion of the lower electrode is provided on the organic insulating layer.

5. The display device of claim 1, wherein
a peripheral portion of the lower electrode is spaced apart from a side surface of the recess portion.

6. A display device comprising:

a substrate;

a first organic insulating layer provided on the substrate;

a second organic insulating layer provided on the first organic insulating layer;

a lower electrode embedded in the first organic insulating layer and the second organic insulating layer;

a rib which has a pixel aperture overlapping the lower electrode;

an auxiliary line which includes a conductive lower portion provided on the rib and an upper portion having an end portion protruding from a side surface of the lower portion;

an upper electrode which faces the lower electrode and is connected to the auxiliary line; and an organic layer which is provided between the lower electrode and the upper electrode and emits light based on a potential difference between the lower electrode and the upper electrode, wherein an upper surface of the lower electrode is exposed from the second organic insulating layer in the pixel aperture and is in contact with the organic layer.

7. The display device of claim 6, wherein the upper surface of the lower electrode and an upper surface of the second organic insulating layer are arranged so as to be flush with each other.

8. The display device of claim 6, wherein the lower electrode has a protrusion which protrudes from an upper surface of the second organic insulating layer in a thickness direction, and a thickness of the protrusion is less than or equal to half of a thickness of the lower electrode.

9. The display device of claim 6, wherein the first organic insulating layer has a first recess portion, the second organic insulating layer has a second recess portion overlapping the first recess portion and larger than the first recess portion as seen in plan view, and the lower electrode is provided in the first recess portion and the second recess portion.

10. The display device of claim 9, wherein a peripheral portion of the lower electrode is provided on the second organic insulating layer.

11. The display device of claim 9, wherein a peripheral portion of the lower electrode is spaced apart from a side surface of the second recess portion.

* * * * *